United States Patent
Tikka et al.

(10) Patent No.: US 7,194,247 B2
(45) Date of Patent: Mar. 20, 2007

(54) DUAL-CHANNEL PASSBAND FILTERING SYSTEM USING ACOUSTIC RESONATORS IN LATTICE TOPOLOGY

(75) Inventors: Pasi Tikka, Helsinki (FI); Juha Ellä, Halikko (FI)

(73) Assignee: Nokia Corporation, Espoo (FI)

( * ) Notice: Subject to any disclaimer, the term of this patent is extended or adjusted under 35 U.S.C. 154(b) by 1093 days.

(21) Appl. No.: 09/965,637

(22) Filed: Sep. 26, 2001

(65) Prior Publication Data

US 2003/0060170 A1    Mar. 27, 2003

(51) Int. Cl.
*H04B 1/16* (2006.01)
(52) U.S. Cl. .................. 455/339; 455/552.1; 455/340; 333/13; 333/190
(58) Field of Classification Search .............. 455/266, 455/339, 340, 552.1; 333/13, 186, 187, 190, 333/193, 195, 202
See application file for complete search history.

(56) References Cited

U.S. PATENT DOCUMENTS

| | | | | |
|---|---|---|---|---|
| 3,727,154 A | * | 4/1973 | Dailing et al. | 333/72 |
| 6,081,171 A | * | 6/2000 | Ella | 333/189 |
| 6,721,544 B1 | * | 4/2004 | Franca-Neto | 455/83 |
| 2003/0179053 A1 | * | 9/2003 | Aigner et al. | 333/189 |

FOREIGN PATENT DOCUMENTS

| | | | |
|---|---|---|---|
| EP | 1058383 | * | 6/2000 |
| EP | 1017170 | | 7/2000 |
| EP | 1058383 | | 12/2000 |
| JP | 2000-349588 | | 6/1999 |

\* cited by examiner

*Primary Examiner*—Quochien B. Vuong
*Assistant Examiner*—Tuan H. Nguyen
(74) *Attorney, Agent, or Firm*—Ware, Fressola, Van Der Sluys & Adolphson LLP

(57) ABSTRACT

A dual-channel passband filtering system having a first, second and third balanced ports for connecting, respectively, to a first transceiver, an antenna and a second transceiver. A first lattice-type passband filter is connected between the first and the second port, and a second lattice-type passband filter is connected between the second and the third port. A phase shifter is used to match the first and second transceiver and the second port. A balun can be used for each port to convert the balanced port to a single-ended port. In each passband filter, two series resonators are use to provide two balanced ends, and two shunt resonators are connected to the series resonators in a crisscross fashion to form a differential or balanced topology. The first and second passband filters have different frequencies.

32 Claims, 6 Drawing Sheets

DUAL-CHANNEL PASSBAND FILTERING SYSTEM USING ACOUSTIC RESONATORS IN LATTICE TOPOLOGY

FIELD OF THE INVENTION

The present invention relates generally to a duplexer and more particularly, duplexer using passband filters incorporating thin-film acoustic resonators (FBARs).

BACKGROUND OF THE INVENTION

It is known that a bulk acoustic-wave (BAW) device is, in general, comprised of a piezoelectric layer sandwiched between two electronically conductive layers that serve as electrodes. When a radio frequency (RF) signal is applied across the device, it produces a mechanical wave in the piezoelectric layer. The fundamental resonance occurs when the wavelength of the mechanical wave is about twice the thickness of the piezoelectric layer. When fabricating BAW devices by depositing thin-film layers on passive substrate materials, one can extend the resonance frequency to the 0.5–10 GHz range. These types of BAW devices are commonly referred to as thin-film bulk acoustic resonators or FBARs. FBARs are usually used in combination to produce passband or stopband filters. The combination of one series FBAR and one parallel, or shunt, FBAR makes up one section, or stage, of the so-called ladder filter. The description of ladder filters can be found, for example, in Ella (U.S. Pat. No. 6,081,171). As shown in FIG. 8f in Ella, two series-connected BAW resonators (hereafter referred to as series resonators) and two shunt-connected BAW resonators (hereafter referred to as shunt resonators) are used to form a two-stage passband filter in a ladder circuit or topology. BAW ladder filters are typically designed so that the series resonators yield a series resonance at a frequency that is approximately equal to, or near, the desired center frequency of the filters, and that the shunt resonators yield a shunt resonance at a frequency that is approximately equal to, or near, the desired center frequency of the filters.

In a typical telecommunication device, such as a mobile phone, an antenna is coupled to both the input of a receiver and to the output of a transmitter. In such an arrangement, a duplexer is used to provide the necessary coupling between the antenna and the respective transceiver. The duplexer is also used to prevent the modulated transmitted signal from being coupled to the receiver. A duplexer is one of key components in a full duplex cellular phone. In the CDMA (code division multiple access) and WCDMA (wideband CDMA) standards, a duplexer is required. In prior art, lattice type filters using surface acoustic wave (SAW) or BAW resonators have been incorporated into a duplexer. Bradley et al. (EP 1 058 383 A2, hereafter referred to as Bradley) discloses a duplexer formed from a plurality of BAW resonators. One of the embodiments of the FBAR duplexer in Bradley is shown in FIG. 1. As shown in FIG. 1, the duplexer 900 comprises a first passband filter 930 connected between the first port 924 and the second port 928, and a second passband filter 932 connected between the second port 928 and the third port 926 via a 90° phase shifter 934, which is used for matching the first passband filter 930 and the second passband filter 932 at the second port 928. Both passband filters 930, 932 are FBAR ladder-type devices. The first passband filter 930 is a 2½-stage ladder circuit, formed by three series resonators 901, 903, 905 and two shunt resonators 907, 909. The second passband filter 930 is a 3½-stage ladder circuit, formed by three series resonators 911, 913, 915 and four shunt resonators 921, 923, 925, 927. A stage, regarding a ladder circuit, is a basic construction cell consisting of one series resonator and one shunt resonator.

Current front-end designs of cellular phones are singled-ended. There is progress towards a fully balanced front-end. A balanced filter provides better electrical performance than a single-ended filter. In a balanced filter, the insertion loss is typically less than a ladder-type filter, and the stopband attenuation is much higher than in a ladder-type filter. Typically, stopband antennuation of a ladder filter is 25 dB. While the electrical performance of a ladder-type filter and duplexer is acceptable, it is desirable and advantageous to provide a passband filter and duplexer with improved electrical performance.

Furthermore, in a telecommunication device where two communication channels use two closely spaced frequencies, it is advantageous and desirable to provide a dual-channel for transmitting and receiving signals in those frequencies.

SUMMARY OF THE INVENTION

According to the first aspect of the present invention, a dual-channel passband filtering device comprising:

a first port;

a second port; and a third port, wherein at least one first passband filter is connected between the first port and the second port, and at least one second passband filter is connected between the second port and the third port via a phase shifter, and wherein each of the first and second passband filters comprises:

a first filter end having a first terminal and a second terminal;

a second filter end having a third terminal and a fourth terminal;

at least two series elements including a first and a second series element; and at least two shunt elements including a first and a second shunt element, wherein the first series element having a first end connected to the first terminal and a second end connected to the third terminal;

the second series element having a first end connected to the second terminal and a second end connected to the fourth terminal;

the first shunt element having a first end connected to the first terminal and a second end connected to the fourth terminal; and the second shunt element having a first end connected to the second terminal and a second end connected to the third terminal, and wherein each of the series and shunt elements includes an acoustic resonator.

According to the present invention, the first passband filter has a first passband frequency and the second passband filter has a second passband frequency different from the first passband frequency. In particular, the first and second passband frequencies are closely spaced in a frequency domain.

According to the present invention, the acoustic resonators are bulk acoustic wave devices of bridge-type or mirror-type. In particular, the acoustic resonators are thin-film bulk acoustic resonators. However, the acoustic resonators can also be surface acoustic wave devices.

According to the present invention, the dual-channel passband filtering system may comprise a balun connected to the second port for receiving a single-ended antenna, a balun connected to the first port for providing a single-ended port for use in conjunction with a single-ended transceiver, and a balun connected to the third port for providing a single-ended port for use in conjunction with a single-ended transceiver.

According to the second aspect of the present invention, a front-end arrangement for use in a telecommunication device, comprising:

an antenna port connected to an antenna system;

a first port capable of conveying signals between a first transceiver connected to the first port and the antenna system via the antenna port; and a second port capable of conveying signals between a second transceiver connected to the second port and the antenna system via the antenna port, wherein at least one first passband filter is connected between the first port and the antenna port for filtering the signals conveyed between the first transceiver and the antenna system, and at least one second passband filter is connected between the second port and the antenna port via a phase shifter for filtering the signals conveyed between the second transceiver and the antenna system, and wherein each of the first and second passband filters comprises:

a first filter end having a first terminal and a second terminal;

a second filter end having a third terminal and a fourth terminal;

at least two series elements including a first and a second series element; and at least two shunt elements including a first and a second shunt element, wherein the first series element having a first end connected to the first terminal and a second end connected to the third terminal;

the second series element having a first end connected to the second terminal and a second end connected to the fourth terminal;

the first shunt element having a first end connected to the first terminal and a second end connected to the fourth terminal, and the second shunt element having a first end connected to the second terminal and a second end connected to the third terminal, and wherein each of the series and shunt elements includes an acoustic resonator.

According to the present invention, it is possible that the antenna port has a first port end and a second port end, and wherein the antenna system has a first antenna connected to the first port end, and a second antenna connected to the second port end. However it is also possible that the antenna system comprises an antenna connected to the antenna port via a balun.

According to the present invention, it is possible that the first transceiver is a transmitter and the second transceiver is a receiver, or the first transceiver is a receiver and the second transceiver is a transmitter. It is also possible that both the first and the second transceivers are receivers.

According to the present invention, it is possible that the first transceiver is connected to the first port via a balun, and the second transceiver is connected to the second port via a balun.

According to the present invention, the first passband filter has a first passband frequency and the second passband filter has a second passband frequency different from the first passband frequency. In particular, the first and second passband frequencies are closely spaced in a frequency domain.

According to the present invention, the telecommunication device can be a mobile phone, and the device can be operated in a code-division multiple access mode in general, and a wideband code-division multiple access mode in particular.

According to the present invention the first transceiver can be a receiver and the first passband filter has a first passband frequency substantially in the range of 1805 MHz –1880 MHz, and the second transceiver can be a receiver and the second passband filter has a second passband frequency substantially in the range of 1930 MHz–1990 MHz.

According to the present invention, the first transceiver can be a transmitter and the first passband filter has a first passband frequency substantially in the range of 1710 MHz–1785 MHz, and the second transceiver can be a receiver and the second passband filter has a second passband frequency substantially in the range of 1805 MHz–1880 MHz.

According to the present invention, the first transceiver can be a transmitter and the first passband filter has a first passband frequency substantially in the range of 1850 MHz–1910 MHz, and the second transceiver can be a receiver and the second passband filter has a second passband frequency substantially in the range of 1930 MHz–1990 MHz.

The present invention will become apparent upon reading the description taken in conjunction with FIGS. 2–6.

BEST MODE FOR CARRYING OUT THE INVENTION

Figure 1:
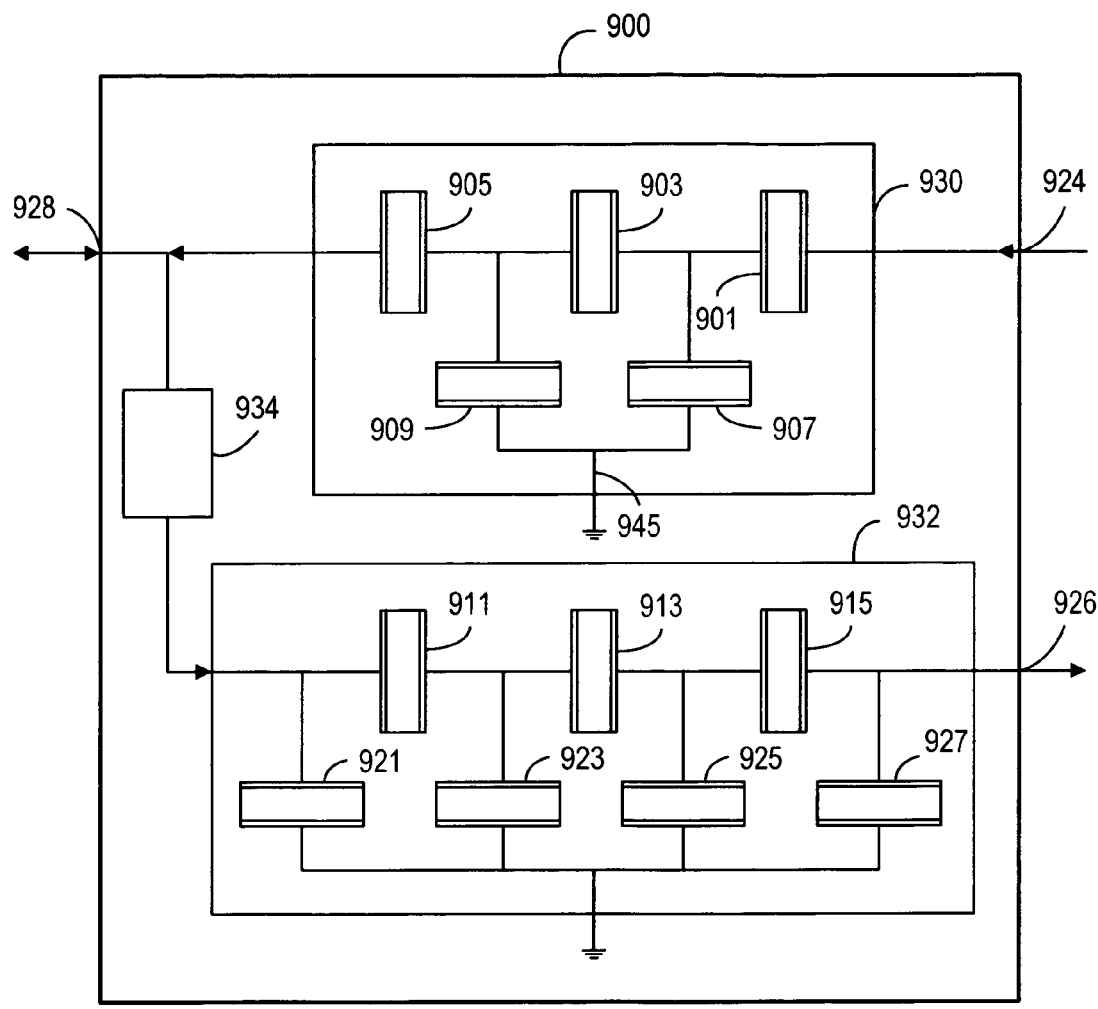
FIG. 1 shows a prior art duplexer incorporating FBARs in a ladder topology.
Figure 2:
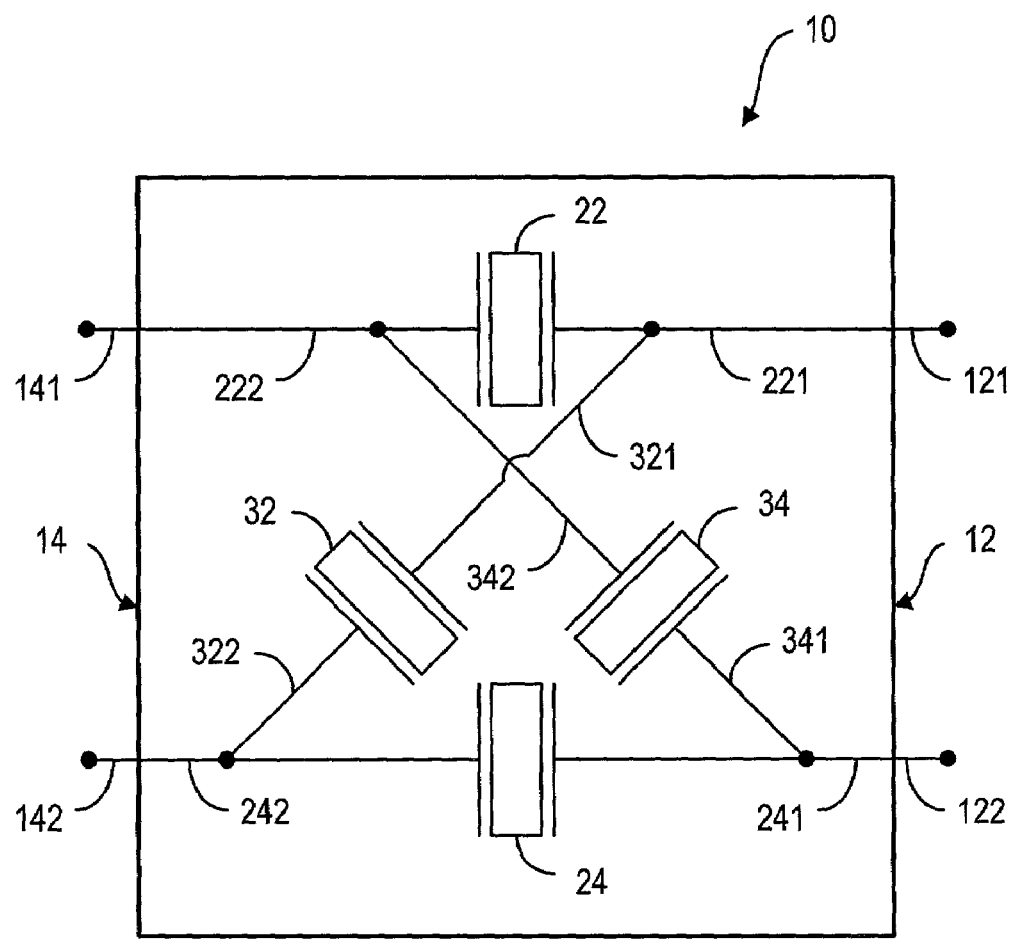
FIG. 2 shows a basic construction cell of a passband filter, according to the present invention.

FIG. 2 shows a basic construction cell of a passband filter 10, according to the present invention. The basic construction cell is also referred to as a stage. In a ladder-type filter, a stage consists of one series resonator and one shunt resonator. The series resonator is provided on a signal conduit in the filter for filtering signals, and the shunt resonator is connected between the output end of the series resonator and the ground. In a lattice-type filter, a stage consists of two series resonators and two shunt resonators. Each of the series resonators is provided a separate signal conduit in the filter, and the shunt resonators are connected between the series resonators in a crisscross fashion. As shown in FIG. 2, the passband filter 10 has a first filter end 12 and a second filter end 14. The first filter end has two terminal ends 121 and 122, and the second filter end 14 has two terminal ends 141, 142. A series resonator 22 having two ends 221, 222 is connected to the terminal ends 121 and 141, and a series resonator 24 having two ends 241, 242 is connected to the terminal ends 122 and 142. A first shunt resonator 32, having two ends 321, 322, is connected between the end 221 of the series resonator 22 and the end 242 of the resonator 24. A second shunt resonator 34 having two ends 341, 342 is connected between the end 241 of the series resonator 24 and the end 222 of the series resonator 22. As shown in FIG. 2, the basic construction cell is symmetrical regarding the connection of the series and shunt resonators. Thus, if the filter end 12 is used as the input end of the passband filter 10, then the filter end 14 is the output end. If the filter end 14 is used as the input end, then the filter end 12 is the output end.

Figure 3:
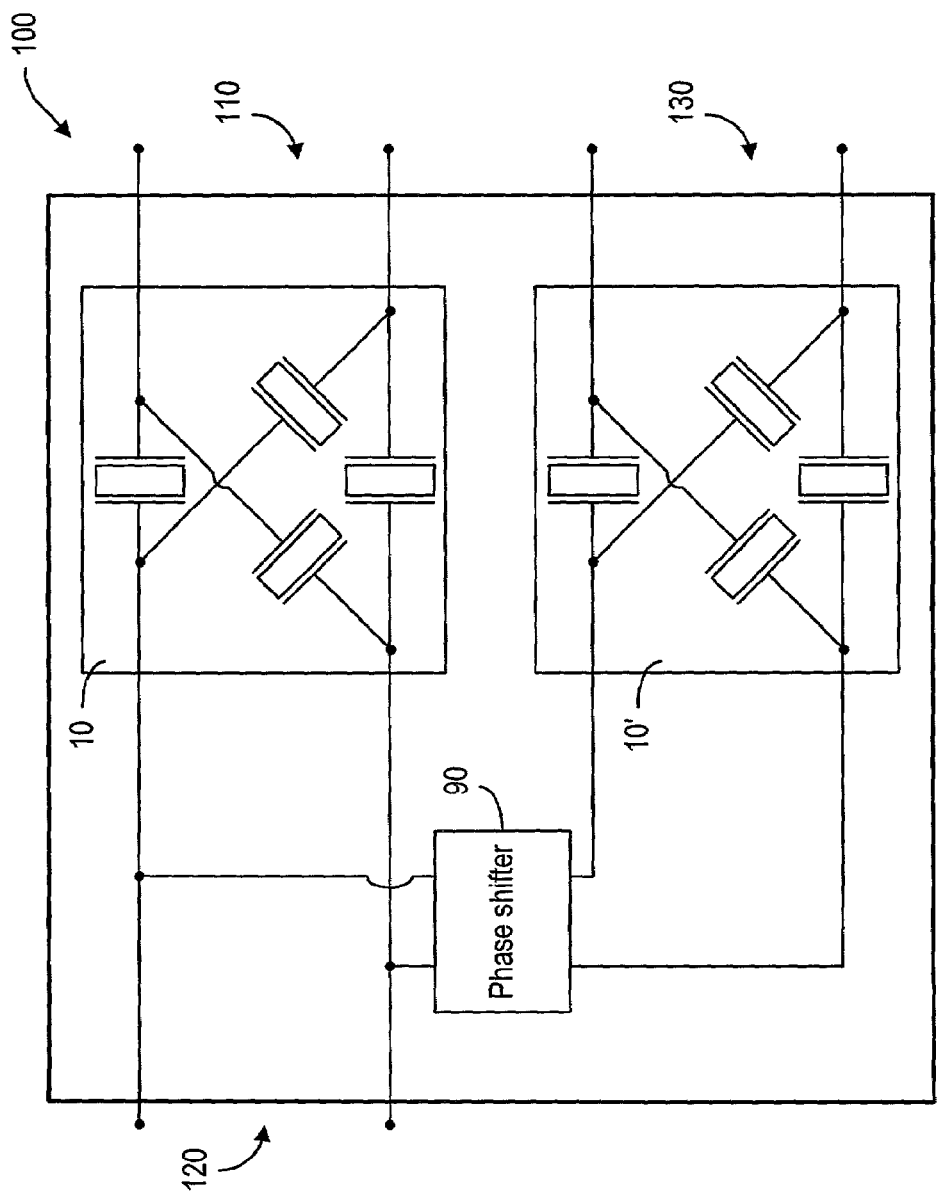
FIG. 3 shows a basic duplexer, according to the present invention.

A duplexer of the simplest structure is one where all three ports (antenna, transmitter and receiver) are balanced. FIG. 3 shows such a duplexer. As shown, the duplexer 100 has a first port 110, a second port 120 and a third port 130 with each of the ports having two port ends. As shown, a first passband filter 10 is connected between the first port 110 and the second port 120, and a second passband filter 10' is connected between the second port 120 and the third port 130 via a phase shifter 90, which is connected to the second port. In the arrangement, as shown in FIG. 3, the second port 120 is used to connect an antenna to the duplexer 100. If the first port 110 is connected to a transmitter, then the third port 130 is connected to a receiver. If the first port 110 is connected to a receiver, then the third port 130 is connected to a transmitter.

As shown in FIG. 3, the duplexer 100 has only one filter stage for filtering signals conveyed through the first port 110, and one filter stage for filtering signals conveyed through the third port 130. However, two or more stages can be used in cascade to filter signals conveyed through the first port 110 or the third port 130. Furthermore, the phase shifter 90 typically provides a 90° phase-shift to signals conveyed to or from the third port 130. However, the phase-shift angle can be anywhere between 40° and 140°. The phase shifter 90 is known in the art. It can be constructed from a transmission line and various inductive and capacitive elements or any combination thereof. Moreover, the phase shifter 90 can also be of an acoustic type or the like.

Figure 4:
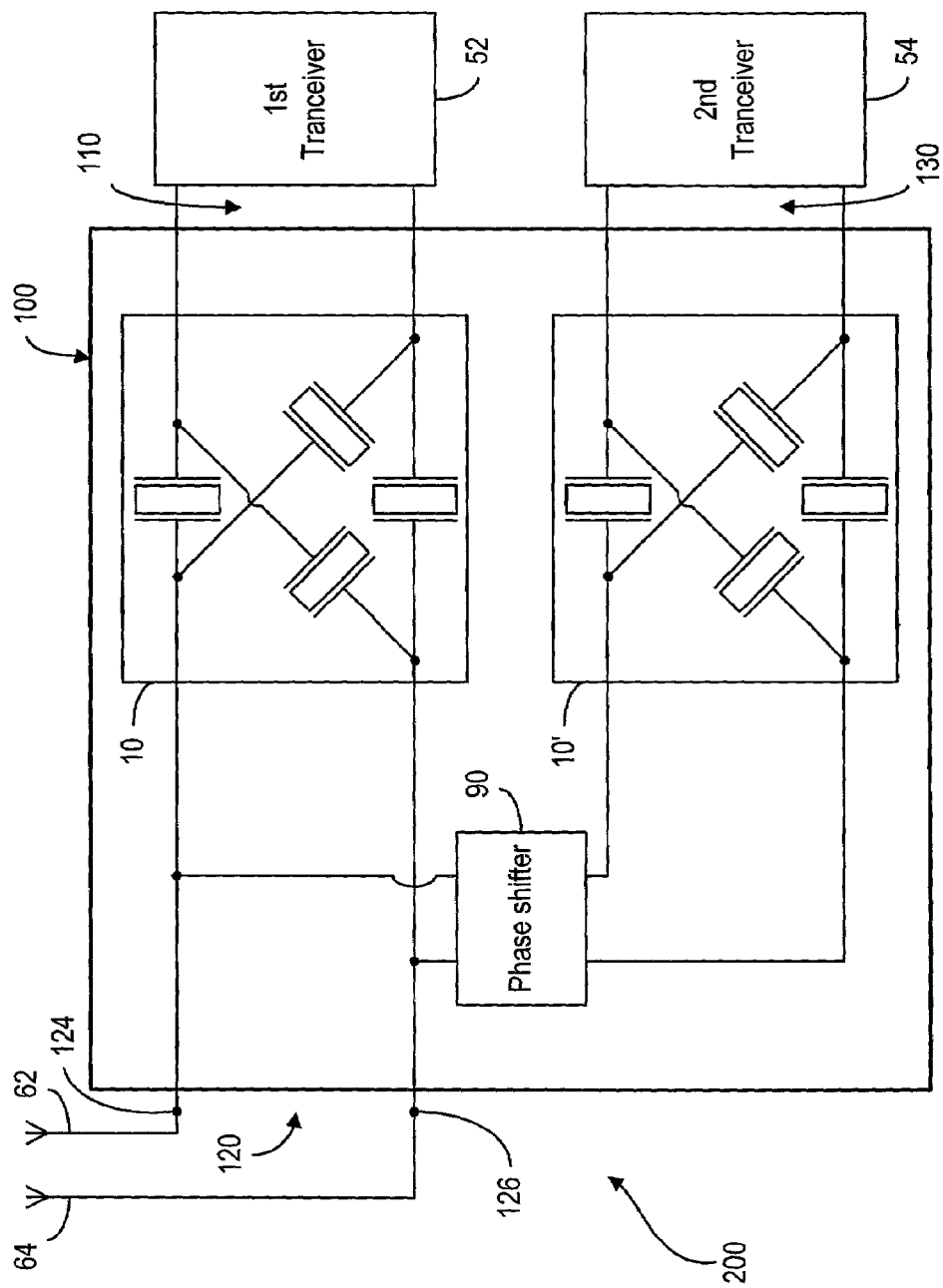
FIG. 4 shows a basic topology using balanced antennas and balanced outputs, according to the present invention.

FIG. 4 shows a basic topology of a duplexer using balanced antennas and balanced outputs, according to the present invention. In the arrangement 200, as shown, the first port 110 is connected to a first transceiver 52 and the third port 130 is connected to a second transceiver 54. The second port 120 has two port ends 124 and 126, separately connected to a first antenna 62 and a second antenna 64. If the first transceiver 52 is used as a transmitter, then the second transceiver 54 is used as a receiver, and vice versa.

It should be noted that when the passband filtering system 100, as shown in FIGS. 3 and 4, is used as a duplexer as described, then the first passband filter 10 and the second passband filter 10' may be closely spaced in frequencies. For example, for use in GSM1800, the passband filter for the transmitter is 1710 . . . 1785 MHz and the passband filter for the receiver is 1805 . . . 1880 MHz. The duplexer 100 can be used as in a full-duplex mode in compliance with CDMA standards. However, the passband filtering system 100 can also be used as a dual-channel filtering device such that the first transceiver 52 and second transceiver 54 (FIG. 4) are operated in different frequencies and independently of each other. In that case, the first passband filter 10 and the second passband filter 10' will have different passband frequencies, corresponding to the operating frequencies of the first and second transceivers. In particular, the passband frequencies of filters 10 and 10' are closely spaced, such as those for GSM1800 and PCS1900. Accordingly, the duplex arrangement can be used as duplex filter to separate transmitter and receiver bands of a certain standard, such as CDMA, GSM1800 or PCS1900, but it could also be used to separate two different receiver bands of two standards in a multi-band phone. For example, the filter 10 is used for the receiver band of 1805–1880 MHz (GSM 1800), and the filter 10' is used for the receiver band of 1930–1990 MHz (PCS 1900)

Figure 5:
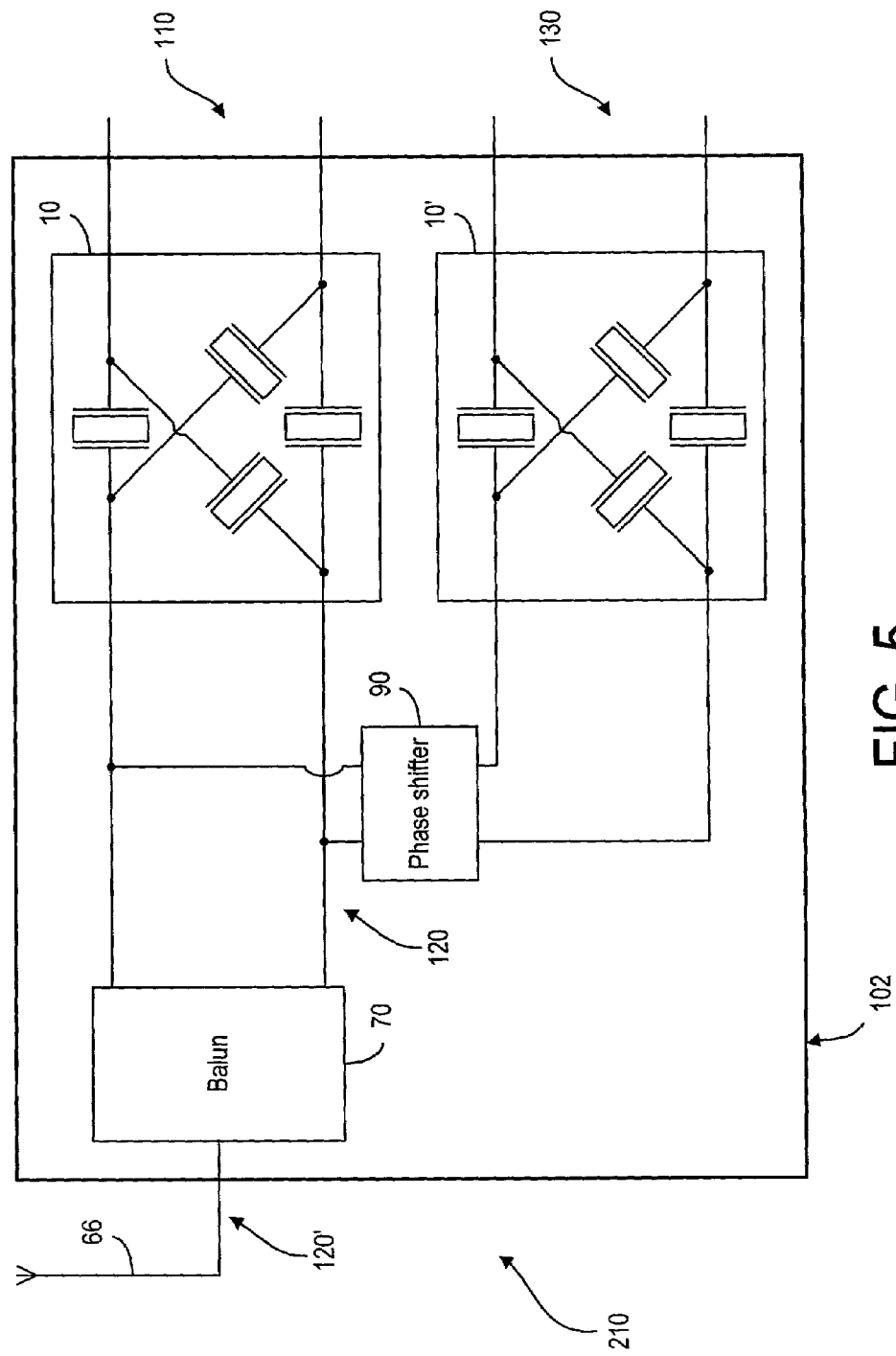
FIG. 5 shows a lattice duplexer having a balun connected to the antenna port for receiving a single-ended antenna.

FIG. 5 shows a lattice duplexer connected to a single-ended antenna via a balun. In the arrangement 210, as shown, the second port 120' of the duplexer 102 has only a single end for connecting to a single antenna 66. The conversion from single-ended antenna port to a balanced port within the duplexer 102 is done by a balun 70.

Figure 6:
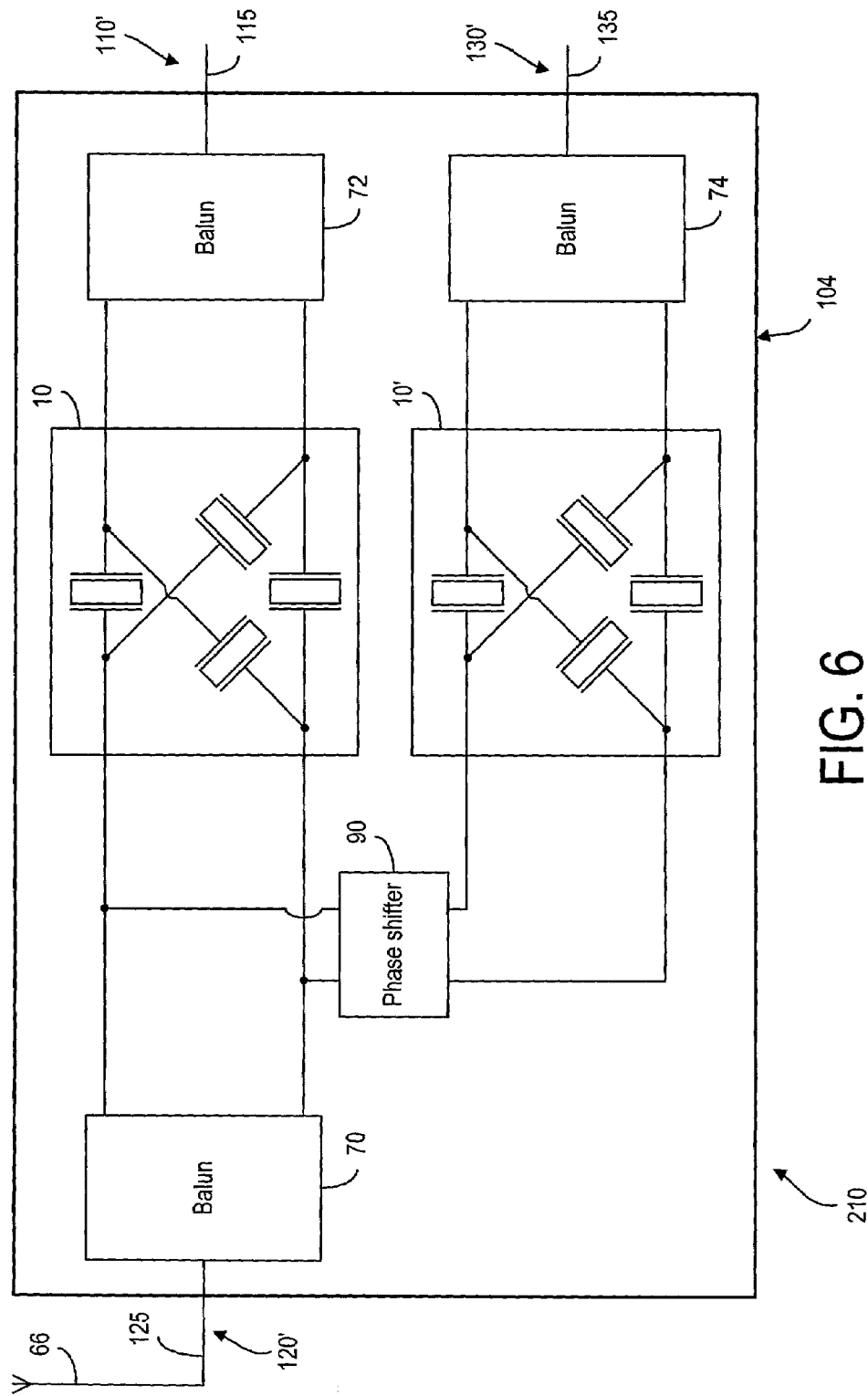
FIG. 6 shows a lattice duplexer with baluns for converting balanced ports to single-ended ports.

FIG. 6 shows a lattice duplexer with baluns for converting single-ended ports to balanced ports within the duplexer. In the arrangment 210 as shown, each of the ports 110', 120' and 130' of the duplexer 104 has a single end, denoted by reference numerals 115, 125 and 135, respectively. The conversion from single-ended ports to balanced ports is done by baluns 70, 72 and 74. As with the passband filtering system 100, as described in conjunction with FIGS. 3 and 4, the passband filtering system 102 in FIG. 5 and the passband filtering system 104 in FIG. 6 can also be as a duplexer or a dual-channel filtering device.

The lattice FBAR duplexer 100, 102 and 104, as described in FIGS. 2–6, can be fabricated using a normal FBAR process. Different filters in the duplexer can be fabricated on a single chip or on a plurality of chips. An FBAR can be either a solidly-mounted resonator (SMR) type BAW device or a bridge-type BAW device. The solidly-mounted resonator type BAW device is also known as a mirror-type BAW device. As it is known in the art, in a bridge-type BAW device, an air gap is provided between the bottom electrode of a BAW device and the substrate. In a mirror-type BAW device, an acoustic mirror structure is provided beneath the bottom electrode. Typically, the mirror structure consists of several layer pairs of high and low acoustic impedance materials, usually a quarter-wave thick.

While the present invention has been disclosed in conjunction with bulk acoustic wave (BAW) devices and thin-film bulk acoustic wave resonators (FBARs) in particular, it is understood that the present invention also covers passband filters and duplexers using surface acoustic wave (SAW) devices or the combination of BAW and SAW devices. Furthermore, the phase shifters and baluns can be integrated components fabricated along with the acoustic resonators, or discrete components.

The transceiver 52 and the transceiver 54, as shown in FIG. 4, can be a transmitter and a receiver, but they can also be both receivers. It is also possible that they are both transmitters.

Thus, although the invention has been described with respect to a preferred embodiment thereof, it will be understood by those skilled in the art that the foregoing and various other changes, omissions and deviations in the form and detail thereof may be made without departing from the spirit and scope of this invention.

What is claimed is:

1. A dual-channel passband filtering device comprising:
a first port;
a second port; and
a third port, wherein at least one first passband filter is connected between the first port and the second port, and at least one second passband filter is connected between the second port and the third port via a phase shifter, and wherein each of the first and second passband filters comprises:
a first filter end having a first terminal and a second terminal;
a second filter end having a third terminal and a fourth terminal;

at least two series elements including a first and a second series element; and at least two shunt elements including a first and a second shunt element, wherein the first series element having a first end connected to the first terminal and a second end connected to the third terminal;

the second series element having a first end connected to the second terminal and a second end connected to the fourth terminal;

the first shunt element having a first end connected to the first terminal and a second end connected to the fourth terminal; and the second shunt element having a first end connected to the second terminal and a second end connected to the third terminal, and wherein each of the series and shunt elements includes an acoustic resonator.

2. The dual-channel passband filtering device of claim 1, wherein the first passband filter has a first passband frequency and the second passband filter has a second passband frequency different from the first passband frequency.

3. The dual-channel passband filtering device of claim 1, wherein the first passband filter has a first passband frequency and the second passband filter has a second passband frequency and wherein the first and second passband frequencies are closely spaced in a frequency domain.

4. The dual-channel passband filtering device of claim 1, wherein the acoustic resonators are bulk acoustic wave devices.

5. The dual-channel passband filtering system of claim 1, wherein at least one of the acoustic resonators is a bridge-type bulk acoustic wave device.

6. The dual-channel passband filtering system of claim 1, wherein at least one of the acoustic resonators is a mirror-type bulk acoustic wave device.

7. The dual-channel passband filtering system of claim 1, wherein the acoustic resonators are thin-film bulk acoustic resonators.

8. The dual-channel passband filtering system of claim 1, wherein the acoustic resonators are surface acoustic wave devices.

9. The dual-channel passband filtering system of claim 1, further comprising a balun connected to the second port for receiving a single-ended antenna.

10. The dual-channel passband filtering system of claim 1, further comprising a balun connected to the first port for providing a single-ended port for use in conjunction with a single-ended transceiver.

11. The dual-channel passband filtering system of claim 1, further comprising a balun connected to the third port for providing a single-ended port for use in conjunction with a single-ended transceiver.

12. A front-end arrangement for use in a telecommunication device, comprising:

an antenna port connected to an antenna system;

a first port capable of conveying signals between a first transceiver connected to the first port and the antenna system via the antenna port; and a second port capable of conveying signals between a second transceiver connected to the second port and the antenna system via the antenna port, wherein at least one first passband filter is connected between the first port and the antenna port for filtering the signals conveyed between the first transceiver and the antenna system, and at least one second passband filter is connected between the second port and the antenna port via a phase shifter for filtering the signals conveyed between the second transceiver and the antenna system, and wherein each of the first and second passband filters comprises:

a first filter end having a first terminal and a second terminal;

a second filter end having a third terminal and a fourth terminal;

at least two series elements including a first and a second series element; and at least two shunt elements including a first and a second shunt element, wherein the first series element having a first end connected to the first terminal and a second end connected to the third terminal;

the second series element having a first end connected to the second terminal and a second end connected to the fourth terminal;

the first shunt element having a first end connected to the first terminal and a second end connected to the fourth terminal; and the second shunt element having a first end connected to the second terminal and a second end connected to the third terminal, and wherein each of the series and shunt elements includes an acoustic resonator.

13. The front-end arrangement of claim 12, wherein the antenna port has a first port end and a second port end, and wherein the antenna system has a first antenna connected to the first port end, and a second antenna connected to the second port end.

14. The front-end arrangement of claim 12, wherein the antenna system comprises an antenna connected to the antenna port via a balun.

15. The front-end arrangement of claim 12, wherein the first transceiver is a transmitter and the second transceiver is a receiver.

16. The front-end arrangement of claim 12, wherein the first transceiver is a receiver and the second transceiver is a transmitter.

17. The front-end arrangement of claim 12, wherein both the first and the second transceivers are receivers.

18. The front-end arrangement of claim 12, wherein the first transceiver is connected to the first port via a balun.

19. The front-end arrangement of claim 12, wherein the second transceiver is connected to the second port via a balun.

20. The front-end arrangement of claim 12, wherein the first passband filter has a first passband frequency and the second passband filter has a second passband frequency different from the first passband frequency.

21. The front-end arrangement of claim 12, wherein the first passband filter has a first passband frequency and the second passband filter has a second passband frequency, and wherein the first and second passband frequencies are closely spaced in a frequency domain.

22. The front-end arrangement of claim 12, wherein the telecommunication device is a mobile phone.

23. The front-end arrangement of claim 12, wherein the telecommunication device is operated in a code-division multiple access mode.

24. The front-end arrangement of claim 12, wherein the telecommunication device is operated in a wideband code-division multiple access mode.

25. The front-end arrangement of claim 12, wherein the first transceiver is a receiver and the first passband filter has a first passband frequency substantially in the range of 1805 MHz–1880 MHz, and wherein the second transceiver is a receiver and the second passband filter has a second passband frequency substantially in the range of 1930 MHz–1990 MHz.

26. The front-end arrangement of claim 12, wherein the first transceiver is a transmitter and the first passband filter has a first passband frequency substantially in the range of 1710 MHz–1785 MHz, and wherein the second transceiver is a receiver and the second passband filter has a second passband frequency substantially in the range of 1805 MHz–1880 MHz.

27. The front-end arrangement of claim 12, wherein the first transceiver is a transmitter and the first passband filter has a first passband frequency substantially in the range of 1850 MHz–1910 MHz, and wherein the second transceiver is a receiver and the second passband filter has a second passband frequency substantially in the range of 1930 MHz–1990 MHz.

28. The front-end arrangement of claim 12, wherein the acoustic resonators are bulk acoustic wave devices.

29. The front-end arrangement of claim 12, wherein at least one of the acoustic resonators is a bridge-type bulk acoustic wave device.

30. The front-end arrangement of claim 12, wherein at least one of the acoustic resonators is a mirror-type bulk acoustic wave device.

31. The front-end arrangement of claim 12, wherein the acoustic resonators are thin-film bulk acoustic resonators.

32. The front-end arrangement of claim 12, wherein the acoustic resonators are surface acoustic wave devices.

\* \* \* \* \*